(12) United States Patent
Naito et al.

(10) Patent No.: US 8,314,825 B2
(45) Date of Patent: Nov. 20, 2012

(54) LASER DIRECT IMAGING APPARATUS AND IMAGING METHOD

(75) Inventors: Yoshitatsu Naito, Ebina (JP); Mitsuhiro Suzuki, Ebina (JP); Tomotsugu Katoh, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 967 days.

(21) Appl. No.: 12/191,901

(22) Filed: Aug. 14, 2008

(65) Prior Publication Data

US 2009/0086009 A1    Apr. 2, 2009

(30) Foreign Application Priority Data

Sep. 3, 2007  (JP) ................................. 2007-228115

(51) Int. Cl.
*B41J 2/47* (2006.01)
(52) U.S. Cl. ........................................ 347/225; 356/401
(58) Field of Classification Search .................. 347/225; 356/401
See application file for complete search history.

(56) References Cited

U.S. PATENT DOCUMENTS

| | | | | |
|---|---|---|---|---|
| 3,619,056 A | * | 11/1971 | Hantusch et al. | 355/91 |
| 4,232,969 A | * | 11/1980 | Wilczynski | 356/401 |
| 4,338,508 A | * | 7/1982 | Jones et al. | 219/121.19 |
| 5,801,868 A | * | 9/1998 | Hayasaka et al. | 359/202.1 |
| 6,583,381 B1 | * | 6/2003 | Duignan | 219/121.69 |
| 6,862,490 B1 | * | 3/2005 | Duignan | 700/121 |
| 2002/0001690 A1 | * | 1/2002 | Selinfreund et al. | 428/64.4 |
| 2003/0157271 A1 | * | 8/2003 | Duignan et al. | 427/596 |
| 2008/0091162 A1 | * | 4/2008 | Maldonado et al. | 604/385.01 |

FOREIGN PATENT DOCUMENTS

WO    WO 02/39794 A2    5/2002

* cited by examiner

*Primary Examiner* — Charlie Peng
*Assistant Examiner* — Peter Radkowski
(74) *Attorney, Agent, or Firm* — Crowell & Moring LLP (57) ABSTRACT

A laser beam direct imaging apparatus and an imaging method which can precisely determine a back-surface-side position with respect to a front-surface-side position even if any kind of photosensitive material is used. In the laser direct imaging apparatus, a laser beam is deflected toward a main scanning direction (X-axis direction) while a workpiece mounted on a table is moved in a sub-scanning direction (Y-axis direction) so that a pattern is imaged on the surface of the workpiece. Hollow pins are disposed on the table so that the tips of the hollow pins 20 project over the surface of the table by a predetermined distance. The workpiece is sucked onto the table so that indentations (indentations by the tips of the hollow pins) are formed on the back surface of the workpiece. When a pattern is imaged on the back surface, imaging is performed with reference to the indentations.

3 Claims, 6 Drawing Sheets

LASER DIRECT IMAGING APPARATUS AND IMAGING METHOD

FIELD OF THE INVENTION

The present invention relates to a laser direct imaging (LDI) apparatus and an imaging method for moving a workpiece in a sub-scanning direction while deflecting a laser beam, which has been modulated based on raster data, toward a main scanning direction so as to image a desired pattern on the workpiece.

BACKGROUND OF THE INVENTION

In an LDI apparatus, CAD data used for designing a circuit pattern are converted into vector data format, and then contours are calculated from the vector data. After that, the contours are further converted into raster data for imaging. From the raster data, ON and OFF pixels for a laser beam are obtained. The ON pixels are irradiated with the laser beam.

Figure 7:
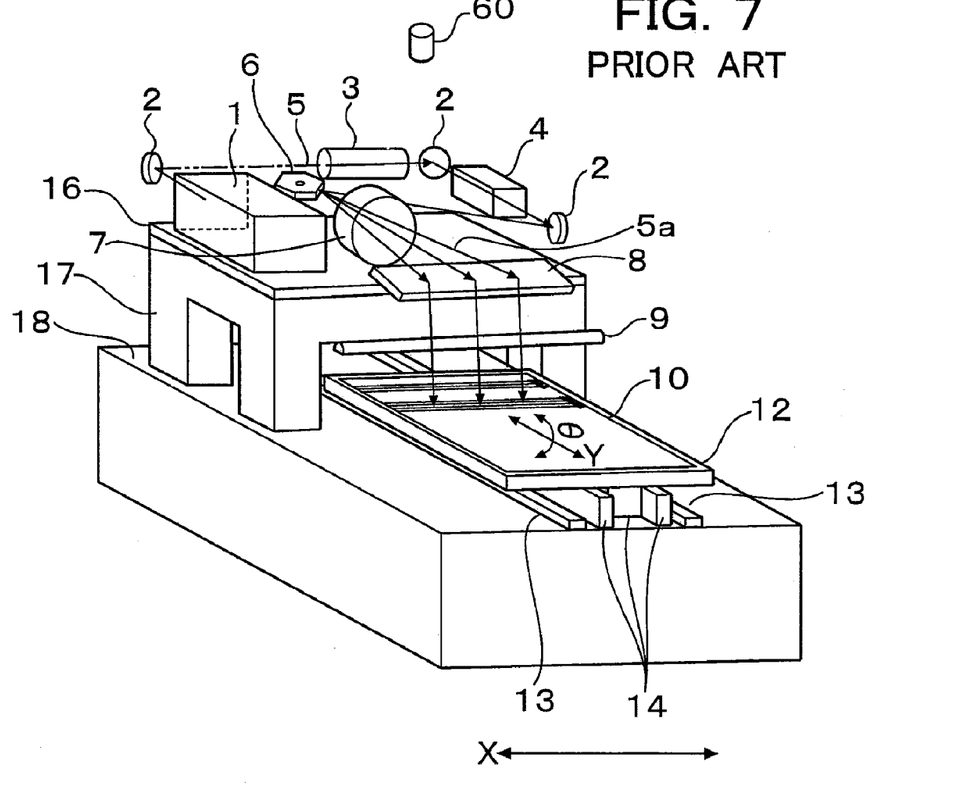
FIG. 7 is a view showing a configuration of background-art laser direct imaging apparatus.

FIG. 7 is a view showing a configuration of background-art LDI apparatus.

A laser source 1 is mounted on an optical table 16. The optical table 16 is disposed on a column 17 on a bed 18. A laser beam 5 emitted from the laser source 1 enters an acousto-optic modulator (hereinafter referred to as "AOM") 4 reflected by mirrors 2 and an expander 3. A laser beam 5a modulated by the AOM 4 is deflected by a polygon mirror 6 and enters an fθ lens 7. The laser beam 5a emerged from the fθ lens 7 is deflected toward the downward direction of FIG. 7 by a reflection mirror 8, and enters a cylindrical lens 9. The laser beam 5a emerged from the cylindrical lens 9 is incident on a workpiece 10. A dry film resist (hereinafter referred to as "DFR"), a photo-resist or the like on the workpiece 10 is exposed to the laser beam 5a. On this occasion, a table 12 where the workpiece 10 is mounted moves in a sub-scanning direction (Y-axis direction in FIG. 7) at a constant speed. A linear motor 14 moves the table 12. A pair of guides 13 guide the table 12. A camera 60 is disposed above the table 12. The camera 60 is mounted on a not-shown shifter by which the camera 60 can be positioned desirably in the X-axis direction. The camera 60 is connected to a not-shown image processor. For example, in order to determine an imaging position, the camera 60 is used for picking up images of alignment marks disposed in the surface of the workpiece 10 (Patent Document 1).

Figures 8A, 8B:
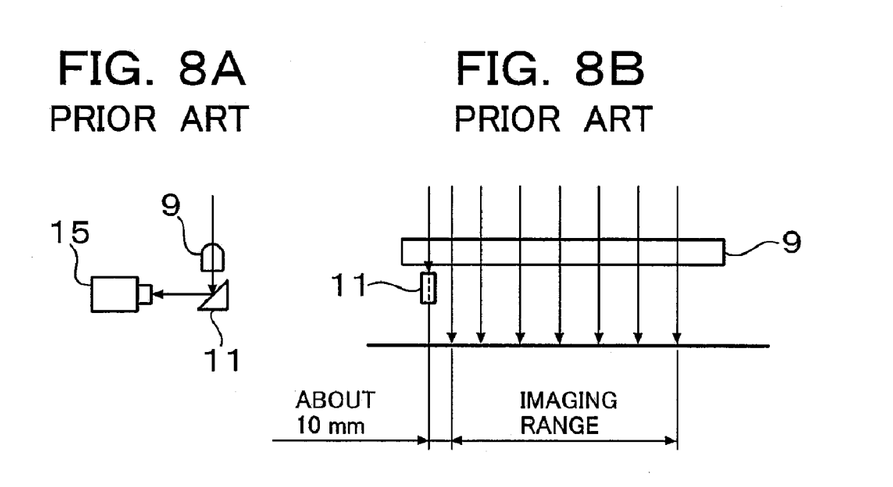
FIGS. 8A and 8B are views showing the position of a start sensor.

FIGS. 8A and 8B are views showing the position of a start sensor. FIG. 8A is a view in the X-axis direction of FIG. 7, and FIG. 8B is a view in the Y-axis direction of FIG. 7.

A mirror 11 is disposed under the left end portion of the cylindrical lens 9 in FIG. 7. A start sensor 15 is disposed in the direction of reflected laser beam from the mirror 11. In order to align the scanning start points of rows, which mean the rows of the exposed pixels by the main scanning (X-axis direction), imaging in each scan in the main scanning direction is started when a predetermined time has passed after the start sensor 15 has detected the laser beam 5a reflected by the mirror 11 (the distance between the detection position and the imaging start position is 10 mm in the illustrated case). Thus, the scanning start points of rows are aligned.

To machine a printed circuit board, xy coordinate axes are determined with reference to alignment marks provided in the surface of the printed circuit board (workpiece) in advance before machining. It is difficult to fix the printed circuit board onto the table so that the xy coordinate axes are set in parallel with the XY coordinate axes of the driving system of the LDI apparatus. Therefore, a not-shown rotating mechanism is provided in the table 12. By the rotating mechanism, the workpiece 10 is rotated so that the xy coordinate axes of the workpiece 10 can be set in parallel with the XY coordinate axes of the driving system of the LDI apparatus.

There are various methods for manufacturing so-called multilayer boards. In a pin lamination method or a mass lamination method, double-sided boards each having conductor layers disposed on the both sides of an insulating layer are laminated to one another with insulating layers interposed. In order to improve the reliability of such a multilayer board as a product, it is necessary to precisely position patterns to be disposed on front and back surfaces of each double-sided board.

When a photosensitive material such as resist is applied to surfaces of conductor layers of each double-sided board, the following technique can be used (Patent Document 1). That is, an exposure unit is provided on the back surface side. When the front surface side is being exposed to light, exposure is performed on the back surface side so as to form an alignment mark thereon. When the back surface side is exposed to light, the back surface side is machined based on the position of the alignment mark formed by the exposure in advance, as described above. According to this technique, a pattern to be disposed on the back surface side can be determined precisely with respect to a pattern disposed on the front surface side.

Patent Document 1: WO 02/39794

However, exposure is merely performed but development is not performed in the above-mentioned technique, that is, a latent image is used. Therefore, when some kind of photosensitive material is used, there is a case where the alignment mark cannot be identified. Development on printed circuit boards or partial development only near portions exposed to light in order to identify the alignment mark increases the number of processes of operation. Therefore such a solution cannot be employed.

SUMMARY OF THE INVENTION

An object of the present invention is to solve the foregoing problem. Another object of the present invention is to provide a laser direct imaging apparatus and an imaging method in which a position on the back surface side can be determined precisely with respect to the front surface side even if any kind of photosensitive material is used.

In order to attain the foregoing objects, a first configuration of the present invention provides a laser direct imaging apparatus for deflecting a laser beam toward a main scanning direction while moving a workpiece, which is mounted on a table, in a sub-scanning direction so as to image a pattern in a front surface of the workpiece. The laser direct imaging apparatus is characterized in that indentations forming unit is provided in the table and for forming indentations with a bottom in a back surface of the workpiece.

A second configuration of the present invention provides an imaging method for deflecting a laser beam toward a main scanning direction while moving a workpiece, which is mounted on a table, in a sub-scanning direction so as to image patterns in front and back surfaces of the workpiece. The imaging method is characterized in that patterns are imaged by the following steps a to e.

a. Step of mounting the workpiece on the table.
b. Step of imaging a pattern in the front surface of the workpiece while forming indentations with a bottom in predetermined positions of the back surface of the workpiece.
c. Step of turning over the workpiece, and mounting the workpiece on the table.

d. Step of determining a coordinate system of the front surface of the workpiece based on the positions of the indentations, and imaging a pattern in the back surface of the workpiece.

e. Step of removing the workpiece from the table.

The positions of the alignment marks can be known even if any kind of photosensitive material is used. Accordingly, a position on the back surface side can be determined precisely with respect to the front surface side. As a result, it is possible to improve the reliability of a multilayer board as a product and the yield of the product.

DETAILED DESCRIPTION OF THE EMBODIMENTS

The present invention will be described below with reference to the drawings.

Figure 1A:
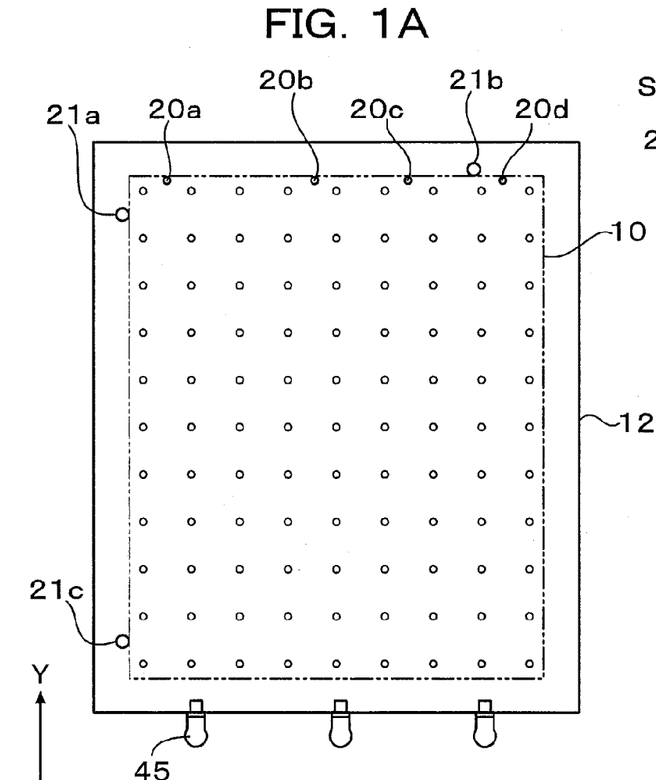
FIGS. 1A-1C are views showing a configuration of a table of a laser direct imaging apparatus according to an embodiment of the present invention.
Figure 1B:
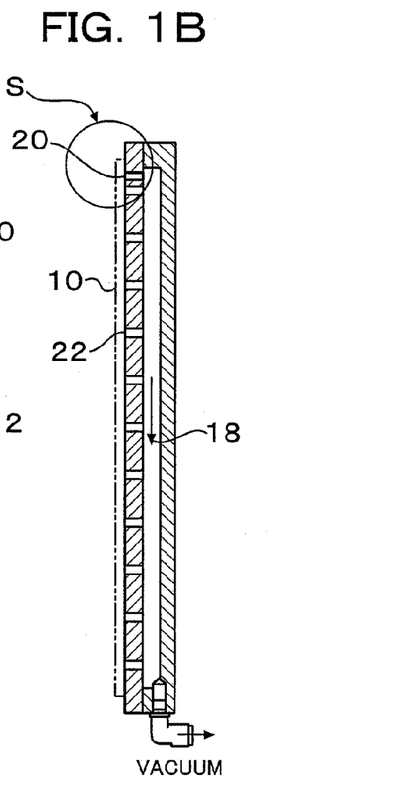
Figure 1C:
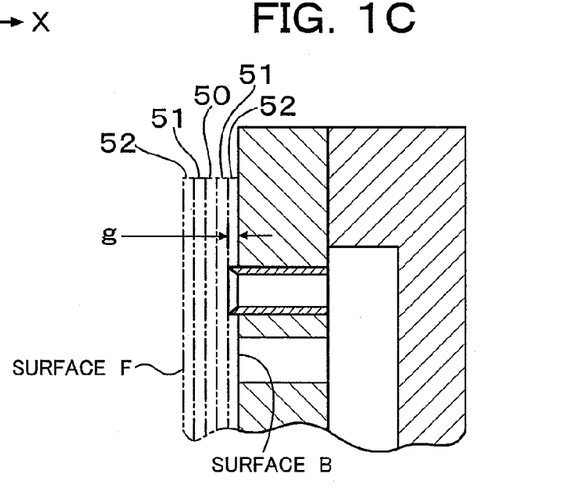

FIGS. 1A-1C are views showing a configuration of a table of a laser direct imaging apparatus according to the present invention. FIG. 1A is a plan view, FIG. 1B is a side sectional view, and FIG. 1C is an enlarged fragmentary sectional view of a portion S in FIG. 1B. Parts the same as or having the same functions as those in FIG. 7 are designated with the same reference numeral and a description thereof is omitted.

A large number of suction holes 22 connected to an internal hollow portion 18 are disposed like a lattice in the surface of a table 12. The hollow portion 18 is connected to a not-shown vacuum system through joints 45. The hollow portion 18 is divided into three blocks by not-shown partitions. The joints 45 are provided for the blocks respectively so that negative pressure can be applied to the blocks individually. Three positioning pins 21a to 21c for positioning the workpiece 10 are disposed on the surface of the table 12. The positioning pins 21a to 21c are circular in section, and the tangent line to the positioning pins 21a and 21c are parallel to the Y axis.

Four hollow pins 20 (20a-20d) are fixed onto the table 12. Each hollow pin 20 is annular in section. The center of each hollow pin 20 is aligned in parallel to the X axis. Each inside of the hollow pins 20 communicates with the hollow portion 18. As shown in FIG. 1C, the inner edge of the tip of each hollow pin 20 is beveled to sharpen the outer edge. The hollow pins 20a-20d project over the surface of the table 12 by a distance g (here 10-50 μm). The hollow pins 20a-20d are placed out of an area where the workpiece 10 will be patterned.

Figure 2:
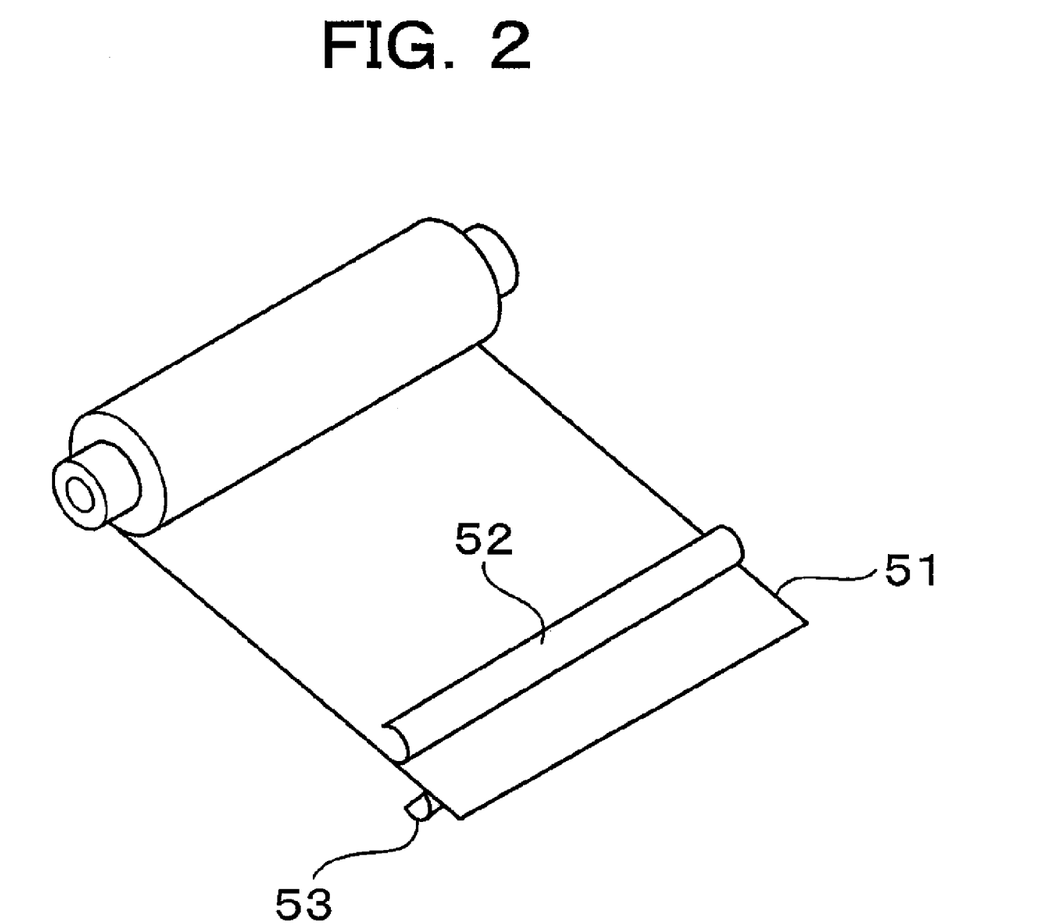
FIG. 2 is a view for explaining the configuration of a dry film.

Here, description will be made about the workpiece 10. The workpiece 10 is constituted by a double-sided board 50, photosensitive resists 51 and carrier films 52. The photosensitive resist 51 is disposed (pasted) on each side of the double-sided board 50. The carrier film 52 is disposed (pasted) outside each photosensitive resist 51. As shown in FIG. 2, the photosensitive resist 51 is kept as a dry film in which the carrier-film 52 whose material is, for example, polyester is disposed on one outer surface of the photosensitive resist 51 and a cover film 53 whose material is polyethylene is disposed on the other outer surface of the photosensitive resist 51. The cover film 53 is removed (separated) when the photosensitive resist 51 is disposed on the double-sided board 50.

Next, description will be made about the procedure of the present invention.

Here, assume that the outer shape of the workpiece is rectangular.

Step 1: The workpiece 10 is mounted on the table 12. On this occasion, the workpiece 10 is disposed so that two adjacent sides of the workpiece 10 touch the positioning pins 21a-21c.

Step 2: The vacuum system is operated to suck the workpiece 10 onto the table 12. By the suction, the workpiece 10 is pressed onto the table 12 so that indentations (which are annular in plan view and V-shaped in thickness direction here. In accordance with the suction force of the vacuum system, the indentations may be formed only in the carrier film 52 or may extend to the photosensitive resist 51.) are formed in the surface of the carrier film 52 (or the surfaces of the carrier film 52 and the photosensitive resist 51) by the hollow pins 20a-20d.

Step 3: The front side surface (The illustrated surface will be referred to as "surface F". The back side surface will be referred to as "surface B.".) is exposed to light. The photosensitive resist is exposed to a laser beam transmitted through the carrier film (16-25 μm thick).

Step 4: When the exposure of the surface F is terminated, the vacuum system is suspended. The workpiece 10 is turned over around the Y axis and mounted on the table 12. On this occasion, two adjacent sides of the workpiece 10 are made to touch the positioning pins 21a to 21c.

Step 5: The vacuum system is operated to suck the workpiece 10 onto the table 12.

Step 6: Any two out of the indentations formed by the hollow pins 20a to 20d (here, we select an indentation 20A formed by the hollow pin 20a and an indentation 20D formed by the hollow pin 20d) are observed by the camera 60, and the coordinates of the centers of the indentations are obtained by image processing.

Step 7: The table 12 is rotated based on the coordinates of the centers of the indentations 20A and 20D so that the xy axes of the pattern machined in the surface F which is now on the back side are brought into parallelism (here line) with the XY coordinate axes of the driving system of the laser direct imaging apparatus. The detail will be described later.

Step 8: The surface B is exposed.

Step 9: The workpiece 10 is removed from the table 12.

The carrier film on each side is removed prior to a development step which is an after process. When the photosensitive material is a negative type material, the photosensitive resist which was not irradiated with (exposed to) the laser beam is removed by developer, and the portion which has been exposed forms the pattern. On the other hand, when the photosensitive material is a positive type material, the portion which was irradiated by the laser beam forms the pattern.

Next, the aforementioned Step 7 will be described further in detail.

Figure 3A:
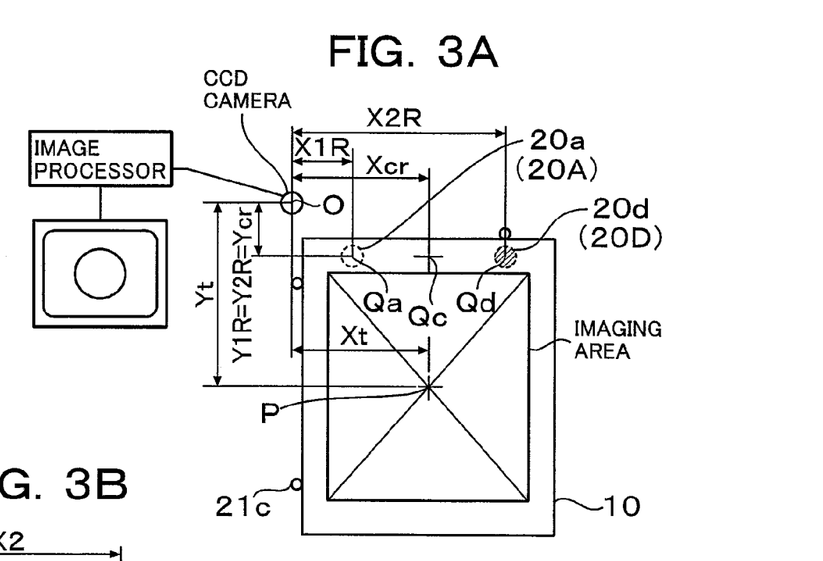
FIGS. 3A-3C are diagrams for explaining the layout of a workpiece with respect to the table according to the embodiment of the present invention.
Figure 3B:
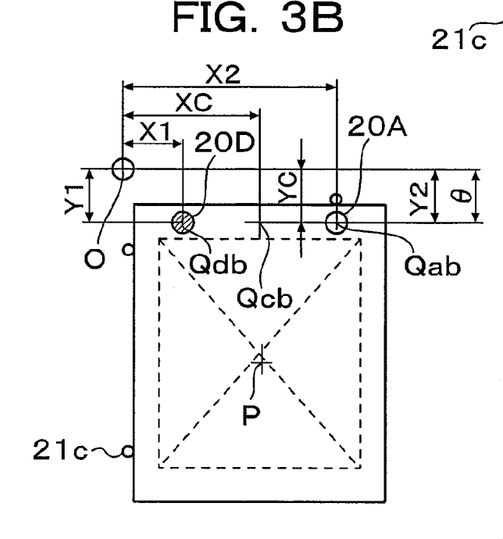
Figure 3C:
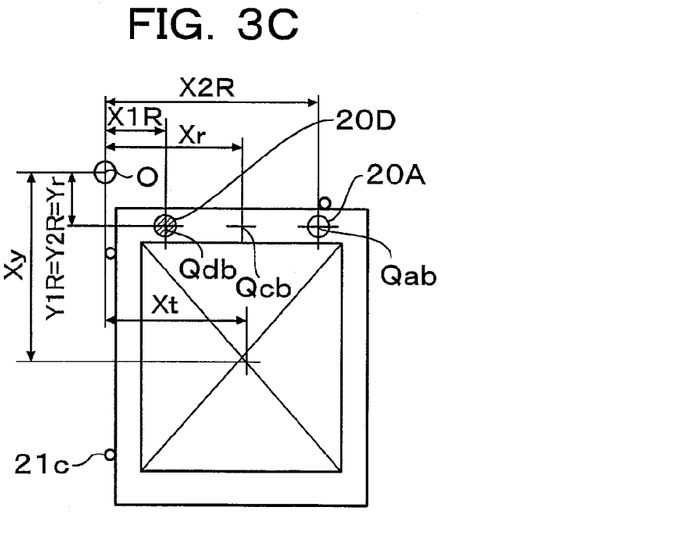

FIGS. 3A-3C are diagrams showing the procedure for positioning the back surface B. FIG. 3A shows the case of the aforementioned Step 2. FIG. 3B shows the case of the aforementioned Step 5, where the surface F has been exposed. FIG. 3C shows the result of the aforementioned Step 7.

Here, assume that the origin O of the XY coordinate axes of the driving system of the laser direct imaging apparatus is on the optical axis of the camera 60. The reference sign P designates the rotation center of the table 12. The hollow pin 20d and the indentation 20D are depicted as shaded portions.

Here, assume that the indentations 20A and 20D formed in the surface B by the hollow pins 20a and 20d respectively are used.

When Qa, Qd and QC designate the center of the hollow pin 20a, the center of the hollow pin 20d and the midpoint of the segment QaQd respectively, the coordinates of the center Qa, the center Qd, the midpoint QC and the rotation center P are expressed by (X1R, Y1R), (X2R, Y2R), (Xcr, Ycr) and (Xt, Yt) respectively. Since the segment QaQd is parallel to the X axis, there is a relation of the form Y1R=Y2R=Ycr.

As shown in FIG. 3A, in Step 2, the indentations 20A and 20D are formed in the surface B by the hollow pins 20a and 20d respectively.

Now assume that the coordinates of the central positions Qab and Qdb of the indentations 20A and 20D and the midpoint QCb (expressed with a suffix b because they are on the surface B side) measured in Step 6 are (X1,Y1), (X2,Y2) and (XC,YC) respectively as shown in FIG. 3B.

In this case, XC, YC and the tilt angle θ can be obtained by Equations 1 to 3 respectively.

$$XC=(X1+X2)/2 \quad \text{(Equation 1)}$$

$$YC=(Y1+Y2)/2 \quad \text{(Equation 2)}$$

$$\Delta\theta=\tan^{-1}\{(X2-X1)/(Y2-Y1)\} \quad \text{(Equation 3)}$$

Displacements ΔX1 and ΔY1 of the midpoint QCb from the midpoint QC in the X-axis and Y-axis directions can be obtained by Equations 4 and 5 respectively.

$$\Delta X1=Xcr-XC \quad \text{(Equation 4)}$$

$$\Delta Y1=Ycr-YC \quad \text{(Equation 5)}$$

Here, when L designates the distance between the midpoint QCb and the rotation center P, the distance L can be obtained from Equation 6, and the tilt Δθ of the segment QCbP can be obtained from Equation 7.

$$L=\sqrt{\{(Xt-XC)^2+(Yt-YC)^2\}} \quad \text{(Equation 6)}$$

$$\Delta\theta=\tan^{-1}\{(XC-Xt)/(YC-Yt)\} \quad \text{(Equation 7)}$$

When the table 12 is rotated by −Δθ, the center coordinates (Xch, Ych) of the corrected midpoint QCb can be expressed by Equations 8 and 9 respectively.

$$Xch=L\times\cos(\theta+\Delta\theta) \quad \text{(Equation 8)}$$

$$Ych=L\times\sin(\theta+\Delta\theta) \quad \text{(Equation 9)}$$

Here, when Xg and Yg designate X-axis-direction and Y-axis-direction distances of the rotation center of the midpoint QCb from a reference point respectively, Xg and Yg can be expressed by Equations 10 and 11 respectively.

$$Xg=XC-Xt \quad \text{(Equation 10)}$$

$$Yg=YC-Yt \quad \text{(Equation 11)}$$

The X-axis-direction and Y-axis-direction displacements of the midpoint QCb caused by the Δθ rotation can be obtained from Equations 12 and 13 respectively.

$$\Delta Xch=Xch-Xg \quad \text{(Equation 12)}$$

$$\Delta Ych=Ych-Yg \quad \text{(Equation 13)}$$

Accordingly, when the table is moved in the X-axis and Y-axis directions by ΔX and ΔY expressed by Equations 14 and 15 respectively, the midpoint QCb can be brought into line with the midpoint QC as shown in FIG. 3C.

$$\Delta X=\Delta X1+\Delta Xch \quad \text{(Equation 14)}$$

$$\Delta Y=\Delta Y1+\Delta Ych \quad \text{(Equation 15)}$$

In the aforementioned description, the indentations 20A and 20D were used. However, any two of the indentations 20A-20D may be used.

Figure 4A:
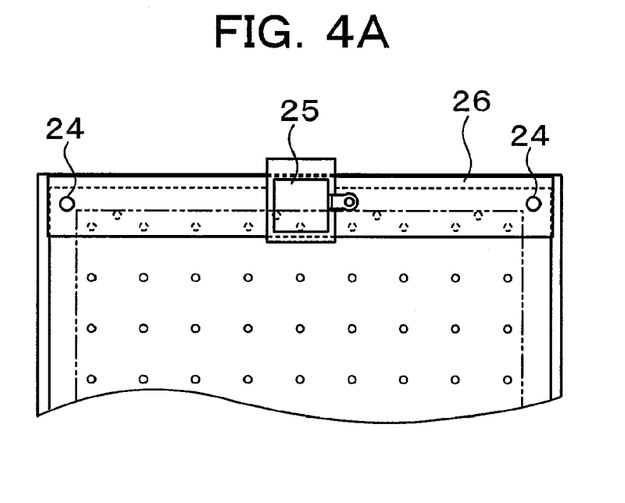
FIGS. 4A and 4B are views showing another embodiment of the present invention.
Figure 4B:
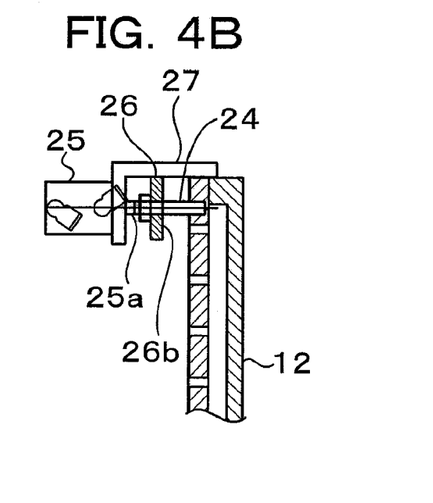

FIGS. 4A and 4B are views showing another embodiment of the present invention. FIG. 4A is a plan view of a table end portion, and FIG. 4B is a side sectional view thereof.

A pair of guide pins 24 are disposed in opposite ends of an end portion of a table 12. An L-shaped support 27 is fixed to a side of the table 12. A cylinder 25 is supported in a central portion of the support 27. A piston rod 25a of the cylinder 25 passes through a not-shown hole formed in the support 27 and projects over the front surface of the table 12. A plate 26 is supported on the tip of the piston rod 25a. The plate 26 is large enough to face hollow pins 20a-20d. When the piston rod 25a is at a standby position (at the position shown by the real line in FIG. 4B), a lower surface 26b of the plate 26 keeps away from the surface of a workpiece 10 mounted on the table 12. When the piston rod 25a is at its operating position, the lower surface 26b is positioned rather on the front surface of the table 12, than on the surface of the workpiece 10.

In this embodiment, the cylinder 25 may be operated at a desired time after the workpiece 10 is sucked onto the table 12 and before the workpiece 10 is released from the suction. For example, assume that each hollow pin 20 is 3 mm in its outer diameter, and a carrier sheet is 8 μm thick. In this case, when pressure of 1 kgf/cm² is applied, enough time for which the pressure should be applied is about 0.2 seconds.

Though not shown, the hollow pins 20a-20d may be supported movably axially and designed to be able to be projected over the surface of the table 12 by a driving unit.

When each hollow pins 20 are pressed to the workpiece 10, the carrier sheet may be cracked around the portions pressed by the hollow pins 20. When the carrier sheet is warped due to the cracks, the imaging accuracy may deteriorate. Therefore, the occurrence of cracks is undesirable.

Figure 5A:
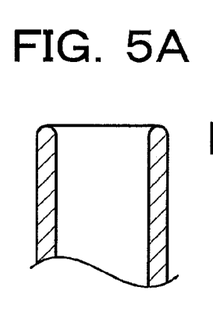
FIGS. 5A-5D are views showing examples of modified hollow pins.
Figure 5B:
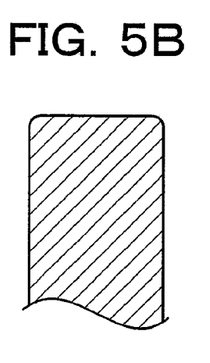
Figure 5C:
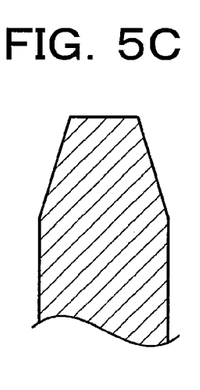
Figure 5D:
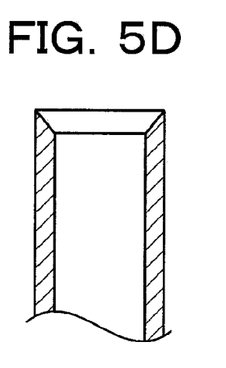

FIGS. 5A-5D are views showing examples of modified hollow pins 20. FIG. 5A shows the case where a hollow pin 20 has a rounded edge in its tip. FIG. 5B shows the case where the hollow pin 20 shown in FIG. 5A is made solid. FIG. 5C shows the case where the hollow pin 20 shown in FIG. 5B is shaped into a truncated cone. FIG. 5D shows the above-mentioned hollow pin 20 shown in FIGS. 3A-3C.

In the case of FIG. 5A, due to the hollow pin 20 whose tip is rounded, it is possible to prevent the carrier sheet form being cracked around the portion pressed by the hollow pin 20. In the case of FIG. 5B, due to the hollow pin 20 which is solid, not only is it possible to prevent the carrier sheet form being cracked around the portion pressed by the hollow pin 20 in the same manner as in the case of FIG. 5A, but it is also possible to make the maintenance easier because the tip of the hollow pin 20 does not wear down so quickly.

Any one of the hollow pins shaped thus can be used. One which can form a clearer indentation may be used selectively in accordance with the thickness or material of the carrier sheet.

When the carrier sheet in a indentation is cut off, the cut-off portion becomes waste. It is therefore practical to adjust the pressing force of the cylinder 25 to a value which is low enough to prevent the carrier sheet from being cut off in a circle.

Figure 6:
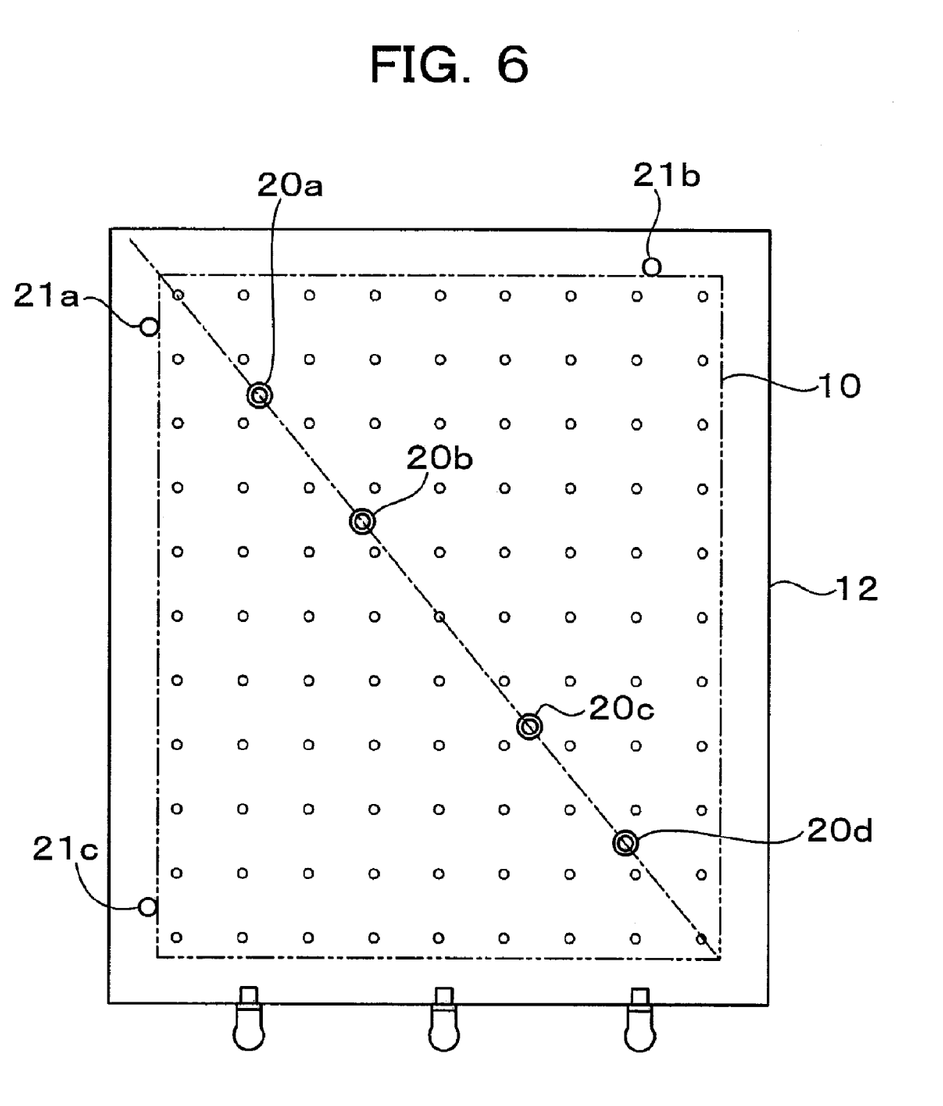
FIG. 6 is a plan view of a table showing further another embodiment of the present invention.

FIG. 6 is a plan view of a table showing further another embodiment of the present invention.

Hollow pins 20*a* to 20*d* are disposed in a diagonal line on the surface where the workpiece 10 is mounted. If indentations can be controlled to be shallow, the hollow pins 20 can be disposed thus in an area where a pattern will be formed. In this manner, the layout of the hollow pins 20 can be less restricted. It is therefore possible to expand the intervals with which the hollow pins 20 are disposed. Thus, the positioning accuracy of the back surface can be improved further.

The present invention can be also applied to a laser direct imaging apparatus which uses a laser diode as a light source and turns on/off the laser diode directly.

The present invention can be also applied to a laser direct imaging apparatus which uses a spatial light modulator (DMD).

What is claimed is:

1. A laser direct imaging apparatus for deflecting a laser beam toward a main scanning direction while moving a workpiece, which is mounted on a table, in a sub-scanning direction so as to image a pattern in a front surface of the workpiece, the laser direct imaging apparatus comprising:

indentation forming pins provided in the table and for forming indentations in a back surface of the workpiece.

2. A laser direct imaging apparatus according to claim 1, further comprising:

a positioning unit for positioning the workpiece in parallel to a surface of the table; wherein:

the positioning unit is disposed in the table with reference to a position of the indentation forming pins.

3. An imaging method for deflecting a laser beam toward a main scanning direction while moving a workpiece, which is mounted on a table, in a sub-scanning direction so as to image patterns in front and back surfaces of the workpiece, the imaging method comprising the steps of:

mounting the workpiece on the table;

imaging a pattern in the front surface of the workpiece while forming indentations by indentation forming pins in a predetermined position of the back surface of the workpiece;

turning over the workpiece, and mounting the workpiece on the table;

determining a coordinate system of the front surface of the workpiece based on the positions of the indentations, and imaging a pattern in the back surface of the workpiece; and removing the workpiece from the table.

* * * * *